US009384817B1

(12) United States Patent
Kim (10) Patent No.: US 9,384,817 B1
(45) Date of Patent: Jul. 5, 2016

(54) REFRESH SIGNAL GENERATION CIRCUIT AND SEMICONDUCTOR DEVICE USING THE SAME

(71) Applicant: SK hynix Inc., Icheon-si Gyeonggi-do (KR)

(72) Inventor: Jae Hoon Kim, Icheon-si Gyeonggi-do (KR)

(73) Assignee: SK HYNIX INC., Icheon-Si (KR)

(*) Notice: Subject to any disclaimer, the term of this patent is extended or adjusted under 35 U.S.C. 154(b) by 0 days.

(21) Appl. No.: 14/686,378

(22) Filed: Apr. 14, 2015

(30) Foreign Application Priority Data

Feb. 13, 2015 (KR) .................. 10-2015-0022142

(51) Int. Cl.
*G11C 11/406* (2006.01)
*G11C 11/4076* (2006.01)

(52) U.S. Cl.
CPC ...... *G11C 11/40615* (2013.01); *G11C 11/4076* (2013.01); *G11C 11/40626* (2013.01)

(58) Field of Classification Search
CPC .............................. G11C 11/406; G11C 7/222
USPC ................................................. 365/222, 194
See application file for complete search history.

(56) References Cited

U.S. PATENT DOCUMENTS

| 6,781,908 | B1* | 8/2004 | Pelley | G11C 7/1045 365/201 |
| 2001/0036118 | A1* | 11/2001 | Johnson | G11C 11/406 365/222 |
| 2007/0091703 | A1* | 4/2007 | Nishimura | G11C 7/04 365/212 |
| 2007/0121408 | A1* | 5/2007 | Yang | G11C 11/406 365/222 |
| 2007/0253269 | A1* | 11/2007 | Pyeon | G11C 7/04 365/222 |
| 2009/0168840 | A1* | 7/2009 | Song | G01K 3/005 374/170 |
| 2011/0169552 | A1* | 7/2011 | Jeong | G01K 3/005 327/512 |

FOREIGN PATENT DOCUMENTS

KR 100803352 B1 2/2008

* cited by examiner

*Primary Examiner* — Michael Tran
(74) *Attorney, Agent, or Firm* — William Park & Associates Ltd.

(57) ABSTRACT

This technology includes: a refresh signal generation unit configured to generate a first preliminary refresh signal with a cycle varying according to temperature changes; a magnification adjustment unit configured to generate a second preliminary refresh signal and a third preliminary refresh signal, which have a cycle variation slope equal to the first preliminary refresh signal and have cycle magnifications different from the first preliminary refresh signal according to the first preliminary refresh signal; and a selection unit configured to output one of the first preliminary refresh signal, the second preliminary refresh signal, and the third preliminary refresh signal as a refresh signal according to a control signal.

18 Claims, 6 Drawing Sheets

REFRESH SIGNAL GENERATION CIRCUIT AND SEMICONDUCTOR DEVICE USING THE SAME

CROSS-REFERENCES TO RELATED APPLICATION

The present application claims priority under 35 U.S.C. §119(a) to Korean application number 10-2015-0022142, filed on Feb. 13, 2015, in the Korean Intellectual Property Office, which is incorporated herein by reference in its entirety.

BACKGROUND

1. Technical Field

Various embodiments relate to a semiconductor circuit, and more particularly, to a refresh signal generation circuit and a semiconductor device using the same.

2. Related Art

A semiconductor device including a volatile memory must necessarily perform a refresh operation in order to prevent loss of data stored in memory cells.

The refresh operation is periodically performed, and the cycle of the refresh operation may be determined to be the cycle of a refresh signal which appoints refresh timing.

SUMMARY

In an embodiment, a refresh signal generation circuit includes a refresh signal generation unit configured to generate a first preliminary refresh signal with a cycle varying according to temperature changes. The refresh signal generation circuit also includes a magnification adjustment unit configured to generate a second preliminary refresh signal and a third preliminary refresh signal, which have a cycle variation slope equal to the first preliminary refresh signal and have cycle magnifications different from the first preliminary refresh signal according to the first preliminary refresh signal. The refresh signal generation circuit also includes a selection unit configured to output one of the first preliminary refresh signal, the second preliminary refresh signal, and the third preliminary refresh signal as a refresh signal according to a control signal.

In an embodiment, a semiconductor device includes a controller chip configured to generate a command for controlling a refresh operation. The semiconductor device also includes a memory chip configured to perform a refresh operation according to the command and a refresh signal generated by selecting one signal among a plurality of preliminary refresh signals having an equal cycle variation slope and cycle magnifications that are different from each other.

In an embodiment, a refresh signal generation circuit includes a refresh signal generation unit configured to generate a first preliminary refresh signal with a cycle varying according to temperature changes generated according to a self-refresh command. The refresh signal generation circuit also includes a magnification adjustment unit configured to a second preliminary refresh signal and a third preliminary refresh signal with different cycle magnifications according to the first preliminary refresh signal. The refresh signal generation circuit also includes a selection unit to output the first preliminary refresh signal, the second preliminary refresh signal, or the third preliminary refresh signal according to a control signal.

DETAILED DESCRIPTION

Hereinafter, a refresh signal generating circuit and a semiconductor device using the same according to the invention will be described below with reference to the accompanying figures through various embodiments. A refresh signal generation circuit capable of achieving efficient refresh cycle variation by taking temperature changes and the characteristics of memory cells into consideration, and a semiconductor device using the same are described herein.

Figure 1:
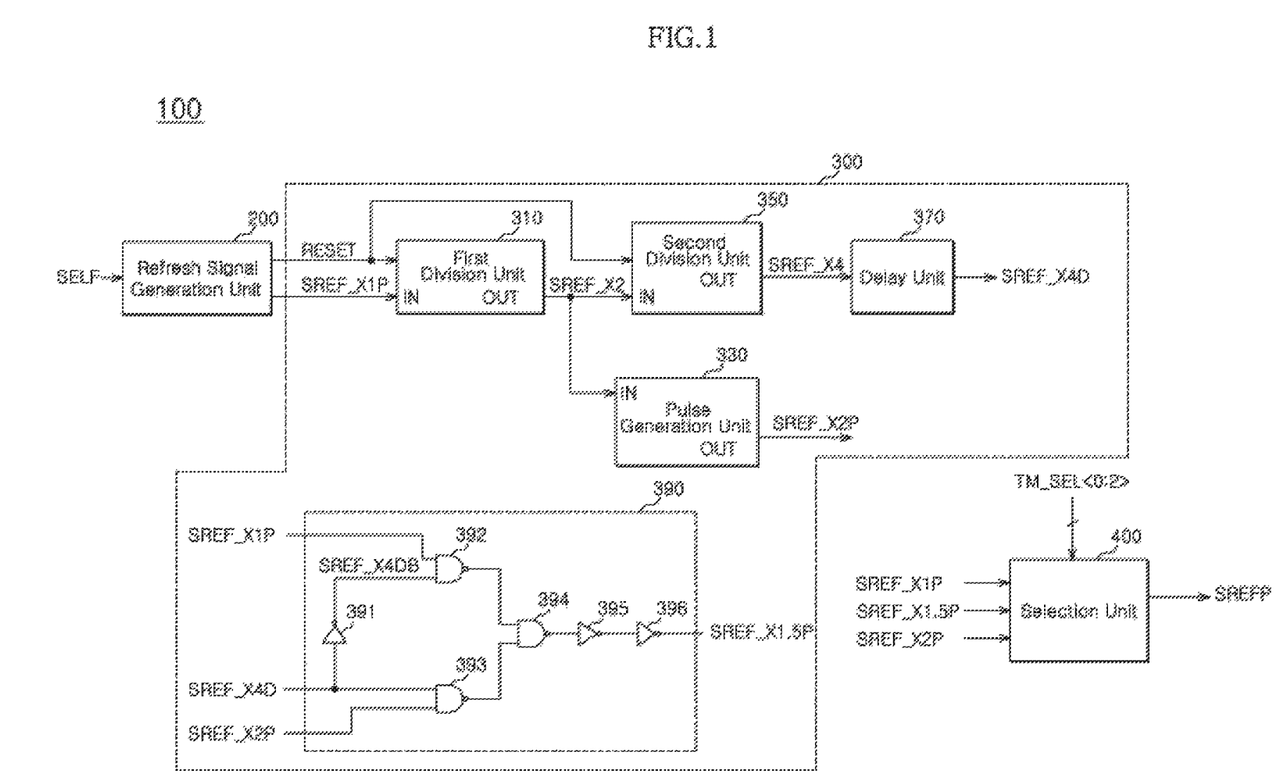
FIG. 1 is a view illustrating the configuration of a refresh signal generation circuit in accordance with an embodiment of the invention.

Referring to FIG. 1, in accordance with an embodiment of the invention, a refresh signal generation circuit 100 may include a refresh signal generation unit 200, a magnification adjustment unit 300, and a selection unit 400.

The refresh signal generation unit 200 may be configured to generate a first preliminary refresh signal SREF_X1P, of which the cycle varies according to temperature changes according to a refresh section signal SELF generated on the basis of a self-refresh command.

Hereinafter, a slope of cycle variation according to temperature changes will be referred to as a cycle variation slope. Further, the cycle variation slope of the first preliminary refresh signal SREF_X1P will be referred to as a first cycle variation slope.

The refresh signal generation unit 200 may be configured to generate a reset signal RESET according to the refresh section signal SELF.

The magnification adjustment unit 300 may be configured to generate a preliminary refresh signal having the same cycle variation slope, i.e. the first cycle variation slope, as the first preliminary refresh signal SREF_X1P; or a plurality of preliminary refresh signals, e.g. a second preliminary refresh signal SREF_X2P; and a third preliminary refresh signal SREF_X1.5P, having different magnifications according to the first preliminary refresh signal SREF_X1P.

The magnification adjustment unit 300 may be configured to generate a preliminary refresh signal having the same cycle variation slope, i.e. the first cycle variation slope, as the first preliminary refresh signal SREF_X1P; or a plurality of preliminary refresh signal SREF_X2P; and a third preliminary refresh signal SREF_X1.5P, having different magnifications according to the first preliminary refresh signal SREF_X1P and the reset signal RESET.

The magnification adjustment unit 300 may generate the second preliminary refresh signal SREF_X2P having a cycle magnification which is an integer multiple of the cycle magnification of the first preliminary refresh signal SREF_X1P. The magnification adjustment unit 300 may also generate the third preliminary refresh signal SREF_X1.5P having a cycle magnification, i.e. an intermediate cycle magnification, which is not an integer multiple of the cycle magnification of the first preliminary refresh signal SREF_X1P. Further, the third preliminary refresh signal SREF_X1.5P corresponds to the middle between the first preliminary refresh signal SREF_X1P and the second preliminary refresh signal SREF_X2P.

The cycle magnification will be described later with reference to FIGS. 5 and 6 below.

The selection unit 400 may be configured to output one of the first preliminary refresh signal SREF_X1P, the second preliminary refresh signal SREF_X2P, and the third preliminary refresh signal SREF_X1.5P as a refresh signal, i.e. a self-refresh signal SREFP according to a control signal TM_SEL<0:2>.

The control signal TM_SEL<0:2> may be stored in a semiconductor chip including the refresh signal generation circuit 100. In the alternative, the control signal TM_SEL<0:2> may be provided from an external semiconductor chip.

The semiconductor chip including the refresh signal generation circuit 100 may be a memory chip. Further, the external semiconductor chip may be a controller chip.

The magnification adjustment unit 300 may include a first division unit 310, a pulse generation unit 330, a second division unit 350, a delay unit 370, and a combination unit 390.

The first division unit 310 may be configured to generate a first division signal SREF_X2 according to the first preliminary refresh signal SREF_X1P and the reset signal RESET.

The pulse generation unit 330 may be configured to generate the second preliminary refresh signal SREF_X2P according to the first division signal SREF_X2.

The second division unit 350 may be configured to generate a second division signal SREF_X4 according to the first division signal SREF_X2 and the reset signal RESET.

The delay unit 370 may be configured to delay the second division signal SREF_X4 by a set period of time and to generate a delayed signal SREF_X4D.

The combination unit 390 may be configured to combine the first preliminary refresh signal SREF_X1P, the delayed signal SREF_X4D, and the second preliminary refresh signal SREF_X2P. Further, the combination unit 390 may be configured to generate the third preliminary refresh signal SREF_X1.5P.

The combination unit 390 may include first to sixth logic gates 391 to 396.

The first logic gate 391 may be configured to generate an inverted delayed signal SREF_X4DB by inverting the delayed signal SREF_X4D.

The second logic gate 392 may be configured to perform a NAND operation on the first preliminary refresh signal SREF_X1P and the inverted delayed signal SREF_X4DB. The second logic gate 392 may also be configured to output a result thereof.

The third logic gate 393 may be configured to perform a NAND operation on the second preliminary refresh signal SREF_X2P and the delayed signal SREF_X4D and to output a result thereof.

The fourth logic gate 394 may be configured to perform a NAND operation on the output of the second logic gate 392 and the output of the third logic gate 393. The fourth logic gate 394 may also output a result thereof.

The fifth and sixth logic gates 395 and 396 may be configured to buffer and output the output of the fourth logic gate 394 as the third preliminary refresh signal SREF_X1.5P.

Figure 2:
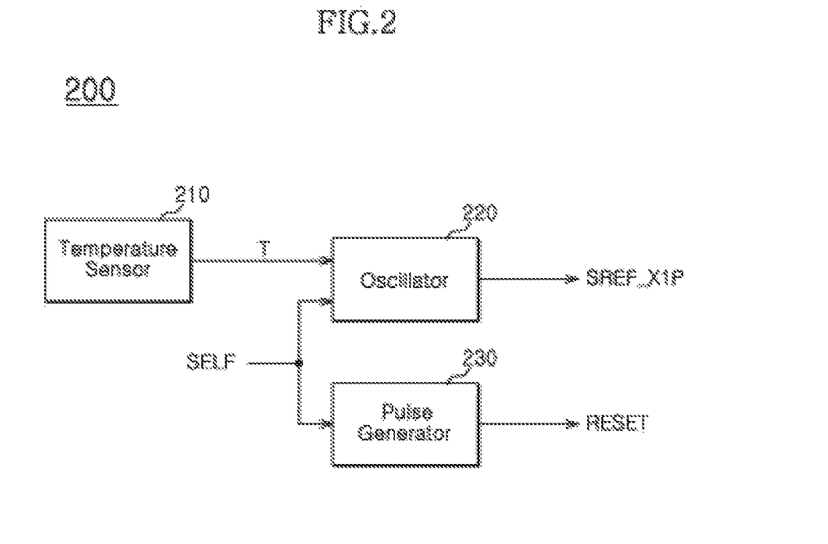
FIG. 2 is a view illustrating the detailed configuration of a refresh signal generation unit capable of being implemented in the circuit of FIG. 1.

Referring to FIG. 2, the refresh signal generation unit 200 may include a temperature sensor 210, an oscillator 220, and a pulse generator 230.

The temperature sensor 210 may be configured to detect the temperature of a semiconductor device and to output a temperature signal T.

The oscillator 220 may be configured to generate the first preliminary refresh signal SREF_X1P during an activation section of the refresh section signal SELF. The oscillator 220 may also be configured to vary the cycle of the first preliminary refresh signal SREF_X1P according to the temperature signal T.

The pulse generator 230 may be configured to generate a reset signal RESET in the form of a pulse synchronized with a rising edge of the refresh section signal SELF.

Figure 3:
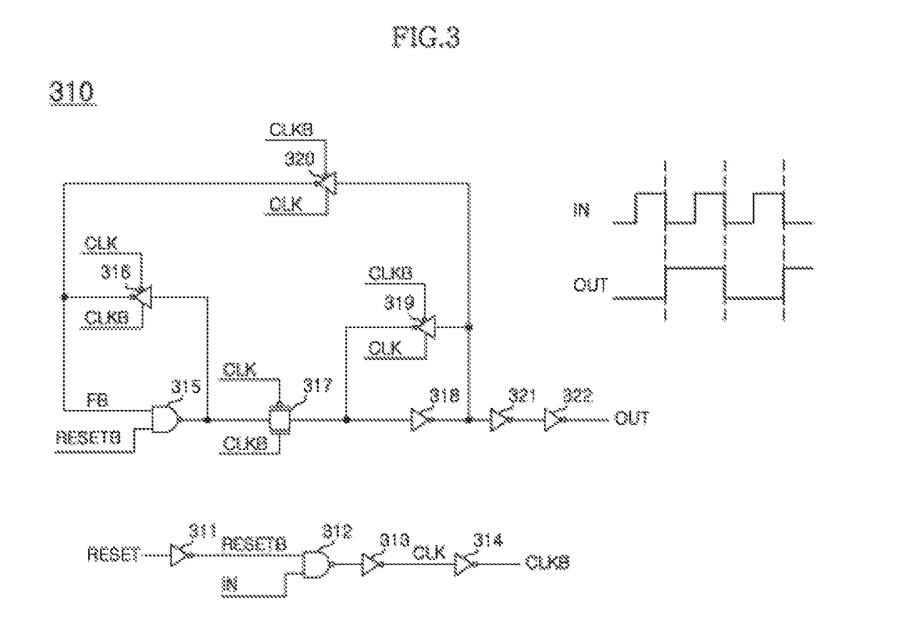
FIG. 3 is a view illustrating the detailed configuration of a first division unit capable of being implemented in the circuit of FIG. 1.

Referring to FIG. 3, referring to a right-side waveform view, the first division unit 310 may be configured to generate an output signal OUT, e.g. the first division signal SREF_X2, having a pulse width synchronized with a falling edge of an input signal IN, e.g. the first preliminary refresh signal SREF_X1P, according to the reset signal RESET.

The first division unit 310 may include first to twelfth logic gates 311 to 322.

The first logic gate 311 may be configured to generate an inverted reset signal RESETB by inverting the reset signal RESET.

The second and third logic gates 312 and 313 may be configured to generate a clock signal CLK by performing an AND operation on the input signal IN and the inverted reset signal RESETB.

The fourth logic gate 314 may be configured to generate an inverted clock signal CLKB by inverting the clock signal CLK.

The fifth logic gate 315 may be configured to perform a NAND operation on the inverted reset signal RESETB and a feedback signal FB. The fifth logic gate 315 may also output a result thereof.

The sixth logic gate 316 may be configured to pass and output the output of the fifth logic gate 315 as the feedback signal FB when the clock signal CLK is inactivated (i.e. when CLK is at a low level and CLKB is at a high level).

The seventh logic gate 317 may be configured to pass the output of the fifth logic gate 315 when the clock signal CLK is inactivated.

The eighth logic gate 318 may be configured to invert the output of the seventh logic gate 317. The eighth logic gate 318 may also be configured to output the inverted output.

The ninth logic gate 319 may be configured to feed the output of the eighth logic gate 318 back as input for the eighth logic gate 318 when the clock signal CLK is activated (i.e. when CLK is at a high level, and CLKB is at a low level).

The tenth logic gate 320 may be configured to output the output of the eighth logic gate 318 as a feedback signal FB when the clock signal CLK is activated.

The eleventh and twelfth logic gates 321 and 322 may be configured to buffer the output of the eighth logic gate 318 and to output an output signal OUT.

Figure 4:
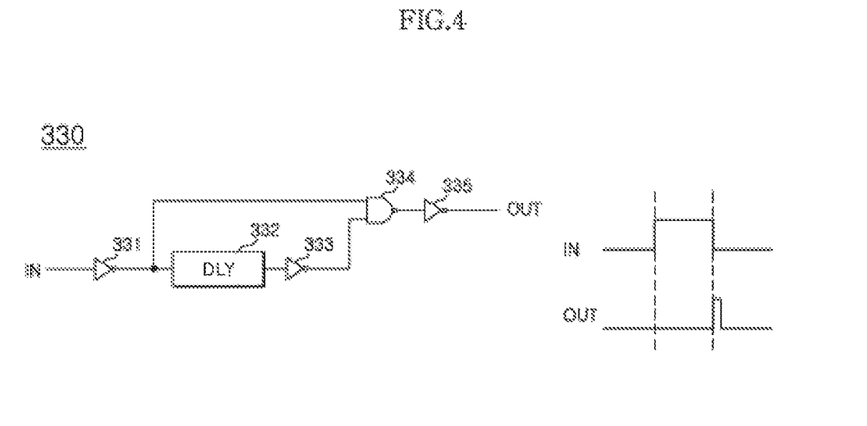
FIG. 4 is a view illustrating the detailed configuration of a pulse generation unit capable of being implemented in the circuit of FIG. 1.

Referring to FIG. 4, referring to the right-side wave form view, the pulse generation unit 330 may be configured to generate an output signal OUT, e.g. the second preliminary refresh signal SREF_X2P, in the form of a pulse synchronized with a falling edge of an input signal IN, e.g. the first division signal SREF_X2.

The pulse generation unit 330 may include first to fifth logic gates 331 to 335.

The first logic gate 331 may be configured to invert an input signal IN, e.g. the first division signal SREF_X2. The first logic gate 331 may also be configured to output the inverted signal.

The second logic gate 332 may be configured to output the output of the first logic gate 331 after delaying the output of the first logic gate 331 by a set period of time.

The third logic gate 333 may be configured to invert the output of the second logic gate 332. The third logic gate 333 may also be configured to output the inverted output.

The fourth and fifth logic gates 334 and 335 may be configured to perform an AND operation on the output of the first logic gate 331 and the output of the third logic gate 333. The fourth and fifth logic gates 334 and 335 may also be configured to generate an output signal OUT, e.g. the second preliminary refresh signal SREF_X2P.

The operation of the refresh signal generation circuit 100 in accordance with an embodiment of the invention will be described below with reference to FIGS. 5 and 6.

Figure 5:
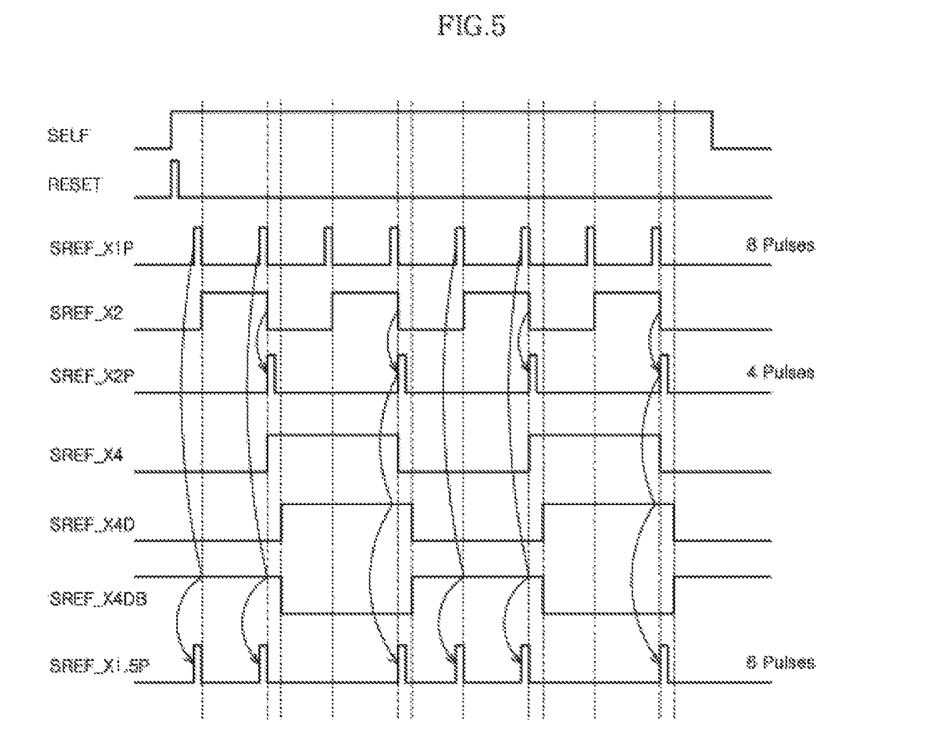
FIG. 5 is a timing diagram showing the operation of the refresh signal generation circuit in accordance with an embodiment of the invention.

Referring to FIG. 5, the waveforms illustrated in FIG. 5 are based on the same temperature condition.

In FIG. 5, as a self-refresh command is inputted, a refresh section signal SELF based on the self-refresh command is activated.

As the refresh section signal SELF is activated, a reset signal RESET is generated. Further, the pulses of a first preliminary refresh signal SREF_X1P are generated by predetermined cycles during the activation section of the refresh section signal SELF.

During the activation section of the refresh section signal SELF, the pulse of the first preliminary refresh signal SREF_X1P is generated eight times. In this instance, a semiconductor device may be refreshed eight times.

The first preliminary refresh signal SREF_X1P is divided to generate a first division signal SREF_X2.

The pulses of a second preliminary refresh signal SREF_X2P synchronized with the falling edges of the pulses of the first division signal SREF_X2 are generated by predetermined cycles.

During the activation section of the refresh section signal SELF, the pulse of the second preliminary refresh signal SREF_X2P is generated four times, i.e. by half of the number of the pulses of the first preliminary refresh signal SREF_X1P. Moreover, in this case, the semiconductor device may be refreshed four times.

According to the first preliminary refresh signal SREF_X1P, the second preliminary refresh signal SREF_X2P, a delayed signal SREF_X4D, and an inverted delayed signal SREF_X4DB, the pulses of a third preliminary refresh signal SREF_X1.5P may be generated.

During the activation section of the refresh section signal SELF, the pulse of the third preliminary refresh signal SREF_X1.5P is generated six times, i.e. by the number corresponding to the middle between the number of the pulses of the first preliminary refresh signal SREF_X1P. In addition, the number of the pulses of the second preliminary refresh signal SREF_X2P, and in this case, the semiconductor device may be refreshed six times.

The third preliminary refresh signal SREF_X1.5P may have a cycle magnification, i.e. an intermediate cycle magnification, corresponding to the middle between the first preliminary refresh signal SREF_X1P and the second preliminary refresh signal SREF_X2P.

As described above, under the same temperature condition, the numbers of refresh operations performed according to the first preliminary refresh signal SREF_X1P, the second preliminary refresh signal SREF_X2P, and third preliminary refresh signal SREF_X1.5P are different from each other.

Under the same temperature condition, during a predetermined period of time, i.e. during the activation section of the refresh section signal SELF, the numbers of the pulses of the first preliminary refresh signal SREF_X1P, second preliminary refresh signal SREF_X2P and third preliminary refresh signal SREF_X1.5P may be different from each other. In addition, such a difference in the number of pulses may be referred to as a difference in cycle magnification.

The same temperature condition described above is based on, for example, temperature "a." Therefore, at temperature "b" other than temperature "a," during the activation section of the refresh section signal SELF, the number of the pulses of the first preliminary refresh signal SREF_X1P, second preliminary refresh signal SREF_X2P and third preliminary refresh signal SREF_X1.5P may vary. Nevertheless, the cycle magnifications may be constantly maintained.

For example, at temperature "b," during the activation section of the refresh section signal SELF, when the number of the pulses of the first preliminary refresh signal SREF_X1P is "16," the numbers of the pulses of the second preliminary refresh signal SREF_X2P and third preliminary refresh signal SREF_X1.5P may be "8" and "12," respectively.

Figure 6:
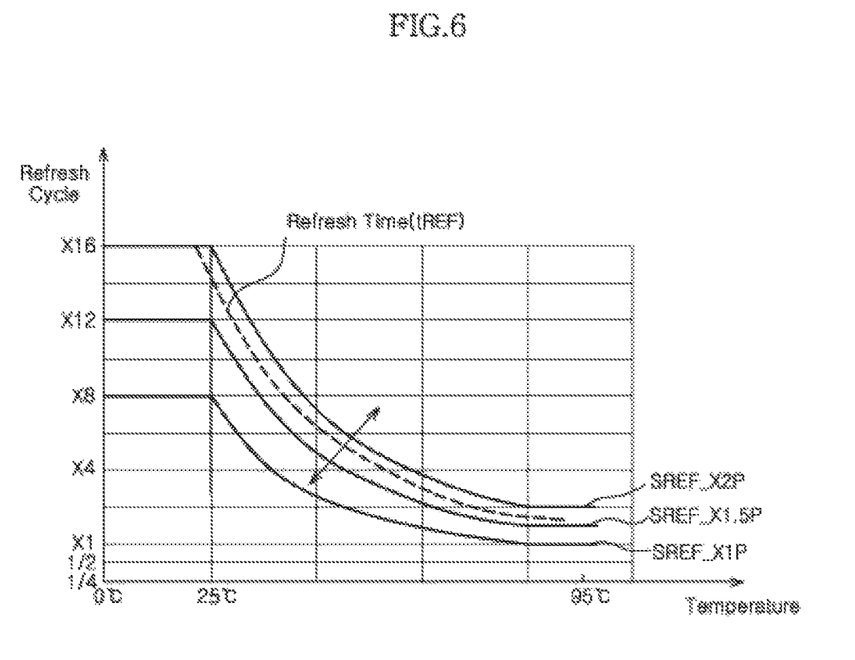
FIG. 6 is a view explaining the operating principle of the refresh signal generation circuit in accordance with an embodiment of the invention.

Referring to FIG. 6, a refresh time tREF increases as temperature decreases, and decreases as temperature increases.

The refresh time tREF represents a period of time during which data of a memory cell can be maintained at an originally written value, i.e. a period of time within which a refresh operation must be again performed after a pervious refresh operation.

In a semiconductor device, it is preferred to perform a minimum of refresh operations in view of power consumption. In addition, it is preferred to perform the refresh operation as frequently as possible in view of stable data conservation so that the refresh cycle is configured to vary depending on temperature changes.

The refresh time tREF may be set to vary depending on temperature changes, and simultaneously, to be shifted, with the slope thereof maintained, according to a variation in the process and voltage (PV) of a semiconductor device.

Therefore, an embodiment of the invention is implemented to generate the first preliminary refresh signal SREF_X1P, second preliminary refresh signal SREF_X2P and third preliminary refresh signal SREF_X1.5P, which have the same slope and cycle magnifications different from each other, as described above. Further, an embodiment of the invention is to select and use a signal, among the generated signals, suitable to a shifted refresh time tREF (see the selection unit 400 shown in FIG. 1).

Since the first preliminary refresh signal SREF_X1P, the second preliminary refresh signal SREF_X2P and the third preliminary refresh signal SREF_X1.5P are selectively used, an optimum refresh operation considering both of data conservation and power consumption can be achieved.

While an aforementioned embodiment of the invention has been described with an example in which the first preliminary refresh signal SREF_X1P, the second preliminary refresh signal SREF_X2P having a cycle magnification which is two multiple of the first preliminary refresh signal SREF_X1P, and the third preliminary refresh signal SREF_X1.5P having a cycle magnification which is an intermediate value between the cycle magnification of the first preliminary refresh signal SREF_X1P and the cycle magnification of the second preliminary refresh signal SREF_X2P, it is possible to generate signals having various cycle magnifications, such as three multiple, four multiple, five multiple, six multiple, or eight multiple, in addition to the aforementioned cycle magnification, for example, in such a manner as to vary the configuration of the logic circuit of the magnification adjustment unit 300.

Figure 7:
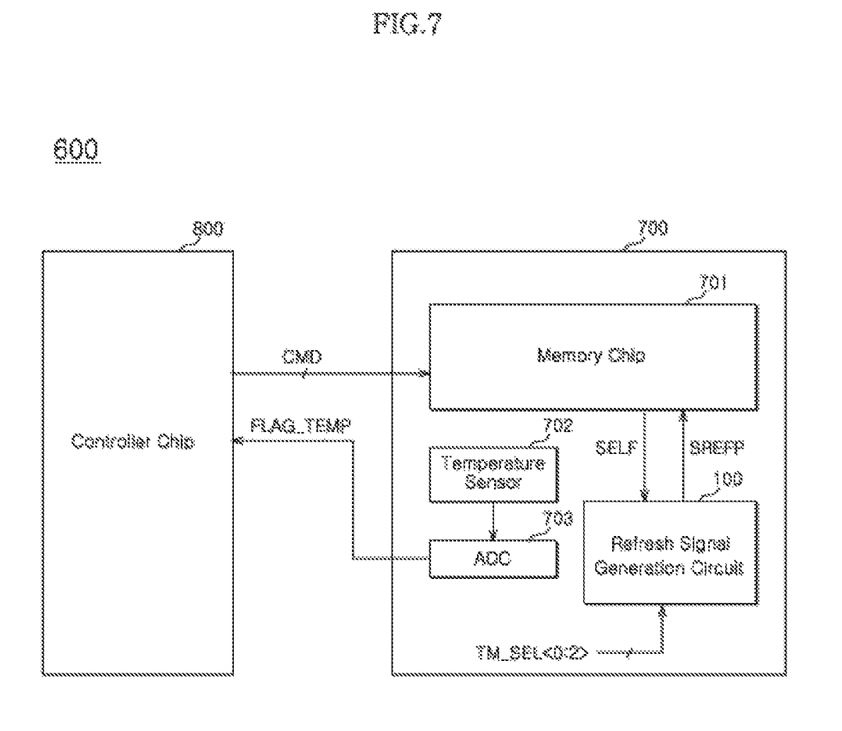
FIG. 7 is a view illustrating the configuration of a semiconductor device in accordance with an embodiment of the invention.

Referring to FIG. 7, a semiconductor device 600 in accordance with an embodiment of the invention will be described below.

In FIG. 7, the semiconductor device 600 may include a memory chip 700 and a controller chip 800.

The controller chip 800 may include a CPU, a GPU, or the like.

The controller chip 800 may be configured to generate a command CMD for controlling the self-refresh and auto-refresh operations of the memory chip 700 according to a temperature signal FLAG_TEMP.

The controller chip 800 may set the cycle of the auto-refresh operation of the memory chip 700 and request initiation of the self-refresh operation using a command CMD.

The controller chip 800 may vary the cycle of the auto-refresh operation of the memory chip 700 according to the temperature signal TMEP_FLAG.

The memory chip 700 may include a refresh signal generation circuit 100, a memory block 701, a temperature sensor 702, and an analog/digital conversion unit (ADC) 703.

The memory block 701 may be configured to perform a refresh operation, e.g. a self-refresh operation, for memory cells according to a self-refresh signal SREFP.

The memory block 701 may be configured to adjust the cycle of an auto-refresh operation for memory cells according to a command CMD provided from the controller chip 800.

The temperature sensor 702 may be configured to detect the temperature of the memory chip 700.

In this case, the refresh signal generation circuit 100 includes a temperature sensor 210, too (see FIG. 2). Therefore, the temperature sensor 210 may be used instead of the temperature sensor 702.

The analog/digital conversion unit 703 may be configured to generate a temperature signal TMEP_FLAG by converting the output of the temperature sensor 702 into a digital value. Further the analog/digital conversion unit 703 may be configured to provide the temperature signal TMEP_FLAG to the controller chip 800.

As described above with reference to FIGS. 1 to 6, the refresh signal generation circuit 100 may be configured to select one signal, among a first preliminary refresh signal SREF_X1P, a second preliminary refresh signal SREF_X2P, and a third preliminary refresh signal SREF_X1.5P, according to a control signal TM_SEL<0:2>. Further, the refresh signal generation circuit 100 may be configured to output the selected signal as a self-refresh signal SREFP.

The controller chip 800 may include a CPU, a GPU, or the like.

The controller chip 800 may include an auto-refresh signal generation unit 801.

The auto-refresh signal generation unit 801 may be configured to adjust the cycle of an auto-refresh signal AREFP according to the temperature signal TMEP_FLAG.

Figure 8:
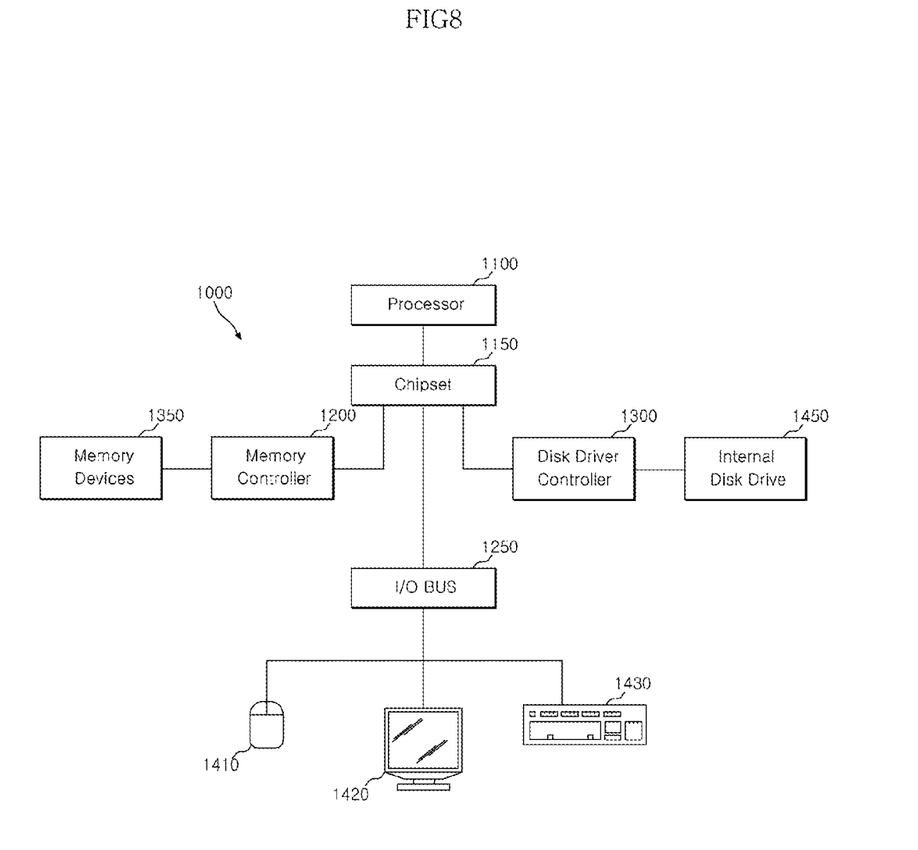
FIG. 8 illustrates a block diagram of a system employing a memory controller circuit in accordance with an embodiment of the invention.

Referring to FIG. 8, a system 1000 may include one or more processors 1100. The processor 1100 may be used individually or in combination with other processors. A chipset 1150 may be electrically coupled to the processor 1100. The chipset 1150 is a communication pathway for signals between the processor 1100 and other components of the system 1000. Other components include a memory controller 1200, an input/output ("I/O") bus 1250, and a disk drive controller 1300. Depending on the configuration of the system 1000, any one of a number of different signals may be transmitted through the chipset 1150.

The memory controller 1200 may be electrically coupled to the chipset 1150. The memory controller 1200 can receive a request from the processor 1100 through the chipset 1150. The memory controller 1200 may be electrically coupled to one or more memory devices 1350. The memory device 1350 may include the semiconductor device described above.

The chipset 1150 may also be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420 and 1430.

The disk drive controller 1300 may also be electrically coupled to the chipset 1150. The disk drive controller 1300 may serve as the communication pathway between the chipset 1150 and one or more internal disk drives 1450. The disk drive controller 1300 and the internal disk drives 1450 may communicate with each other or with the chipset using virtually any type of communication protocol.

While certain embodiments have been described above, it will be understood to those skilled in the art that the embodiments described are by way of examples only. Accordingly, the circuit and device described should not be limited based on the described embodiments. Rather, the circuit and device described should only be limited in light of the claims that follow when taken in conjunction with the above description and accompanying figures.

What is claimed is:

1. A refresh signal generation circuit comprising:
a refresh signal generation unit configured to generate a first preliminary refresh signal with a cycle varying according to temperature changes;
a magnification adjustment unit configured to generate a second preliminary refresh signal and a third preliminary refresh signal, which have a cycle variation slope equal to the first preliminary refresh signal and have cycle magnifications different from the first preliminary refresh signal according to the first preliminary refresh signal; and
a selection unit configured to output one of the first preliminary refresh signal, the second preliminary refresh signal, and the third preliminary refresh signal as a refresh signal according to a control signal,
wherein, in accordance with the cycle magnifications, numbers of refresh operations to be performed according to the first preliminary refresh signal, the second preliminary refresh signal and the third preliminary refresh signal, respectively, during a predetermined period of time under an equal temperature condition are different from each other.

2. The refresh signal generation circuit according to claim 1, wherein the refresh signal generation unit is configured to generate the first preliminary refresh signal, of which the cycle varies depending on temperature changes, in response to a refresh section signal generated according to a refresh command.

3. The refresh signal generation circuit according to claim 1, wherein the refresh command is a self-refresh command.

4. The refresh signal generation circuit according to claim 1, wherein, in accordance with the cycle magnifications, numbers of refresh operations to be performed according to the first preliminary refresh signal, the second preliminary refresh signal and the third preliminary refresh signal, respectively, during an activation section of a refresh section signal under an equal temperature condition are different from each other.

5. The refresh signal generation circuit according to claim 1, wherein the refresh signal generation unit comprises:
   a temperature sensor configured to detect a temperature and to output a temperature signal; and
   an oscillator configured to generate the first preliminary refresh signal in response to a refresh section signal, and to vary the cycle of the first preliminary refresh signal according to the temperature signal.

6. The refresh signal generation circuit according to claim 1, wherein the magnification adjustment unit comprises:
   a first division unit configured to generate a first division signal according to the first preliminary refresh signal and a reset signal;
   a pulse generation unit configured to generate the second preliminary refresh signal according to the first division signal;
   a second division unit configured to generate a second division signal according to the first division signal and the reset signal;
   a delay unit configured to delay the second division signal by a set period of time, and to generate a delayed signal; and
   a combination unit configured to combine the first preliminary refresh signal, the delayed signal, and the second preliminary refresh signal, and to generate the third preliminary refresh signal.

7. The refresh signal generation circuit according to claim 1, wherein the magnification adjustment unit is configured to generate the second preliminary refresh signal in which the cycle magnification of the second preliminary refresh signal corresponds to an integer multiple of the first preliminary refresh signal, and to generate the third preliminary refresh signal in which the cycle magnification of the third preliminary refresh cycle is in between the first preliminary refresh signal and the second preliminary refresh signal.

8. A semiconductor device comprising:
   a controller chip configured to generate a command for controlling a refresh operation; and
   a memory chip configured to perform a refresh operation according to the command and a refresh signal generated by selecting one signal among a plurality of preliminary refresh signals having an equal cycle variation slope and cycle magnifications that are different from each other,
   wherein the memory chip comprises:
   a memory block configured to perform a refresh operation for memory cells according to the refresh signal; and
   a refresh signal generation circuit configured to generate the plurality of preliminary refresh signals according to the command, and to generate the refresh signal by selecting the one signal among the plurality of preliminary refresh signals.

9. The semiconductor device according to claim 8, wherein the controller chip is configured to generate the command according to a temperature signal.

10. The semiconductor device according to claim 8, wherein the controller chip is configured to generate the command for varying the cycle of an auto-refresh operation of the memory chip according to a temperature signal.

11. The semiconductor device according to claim 8, wherein the memory chip further comprises:
    a temperature sensor configured to detect a temperature; and
    an analog/digital conversion unit configured to generate a temperature signal by converting an output of the temperature sensor into a digital value.

12. The semiconductor device according to claim 8, wherein the refresh signal generation circuit comprises:
    a refresh signal generation unit configured to generate a first preliminary refresh signal with a cycle varying depending according to temperature changes;
    a magnification adjustment unit configured to generate a second preliminary refresh signal and a third preliminary refresh signal, which have a cycle variation slope equal to the first preliminary refresh signal and have cycle magnifications different from the first preliminary refresh signal according response to the first preliminary refresh signal; and
    a selection unit configured to output one of the first preliminary refresh signal, the second preliminary refresh signal, and the third preliminary refresh signal as a refresh signal according to a control signal.

13. The semiconductor device according to claim 12, wherein in accordance with the cycle magnifications, numbers of refresh operations to be performed according to the first preliminary refresh signal, the second preliminary refresh signal and the third preliminary refresh signal, respectively, during a predetermined period of time under an equal temperature condition are different from each other.

14. The semiconductor device according to claim 12, wherein the refresh signal generation unit is configured to generate the first preliminary refresh signal, of which the cycle varies depending on temperature changes according to a refresh section signal generated according to a refresh command.

15. The semiconductor device according to claim 12, wherein the refresh signal generation unit comprises:
    a temperature sensor configured to detect a temperature and to output a temperature signal; and
    an oscillator configured to generate the first preliminary refresh signal according to a refresh section signal, and to vary the cycle of the first preliminary refresh signal according to the temperature signal.

16. The semiconductor device according to claim 12, wherein the magnification adjustment unit comprises:
    a first division unit configured to generate a first division signal according to the first preliminary refresh signal and a reset signal;
    a pulse generation unit configured to generate the second preliminary refresh signal according to the first division signal;
    a second division unit configured to generate a second division signal according to the first division signal and the reset signal;
    a delay unit configured to delay the second division signal by a set period of time, and to generate a delayed signal; and
    a combination unit configured to combine the first preliminary refresh signal, the delayed signal, and the second preliminary refresh signal, and to generate the third preliminary refresh signal.

17. The semiconductor device according to claim 8, wherein the plurality of preliminary refresh signals comprises first to third preliminary refresh signals, the cycle magnification of the second preliminary refresh signal corresponds to an integer multiple of the first preliminary refresh signal, and the third preliminary refresh signal has a cycle magnification corresponding to be in between the cycle magnification of the first preliminary refresh signal and the cycle magnification of the second preliminary refresh signal.

18. A refresh signal generation circuit comprising:

a refresh signal generation unit configured to generate a first preliminary refresh signal with a cycle varying according to temperature changes generated according to a self-refresh command;

a magnification adjustment unit configured to a second preliminary refresh signal and a third preliminary refresh signal with different cycle magnifications according to the first preliminary refresh signal; and a selection unit to output the first preliminary refresh signal, the second preliminary refresh signal, or the third preliminary refresh signal according to a control signal, wherein, in accordance with the cycle magnifications, numbers of refresh operations to be performed according to the first preliminary refresh signal, the second preliminary refresh signal and the third preliminary refresh signal, respectively, during a predetermined period of time under an equal temperature condition are different from each other.

\* \* \* \* \*